(12) United States Patent
Nakamura

(10) Patent No.: US 9,859,143 B2
(45) Date of Patent: Jan. 2, 2018

(54) ADHESION DETECTING METHOD

(71) Applicant: DISCO CORPORATION, Tokyo (JP)

(72) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/219,737

(22) Filed: Jul. 26, 2016

(65) Prior Publication Data

US 2017/0040201 A1 Feb. 9, 2017

(30) Foreign Application Priority Data

Aug. 3, 2015 (JP) .................................. 2015-153425

(51) Int. Cl.
*H01L 21/66* (2006.01)
*H01L 21/683* (2006.01)

(52) U.S. Cl.
CPC .......... *H01L 21/6836* (2013.01); *H01L 22/12* (2013.01); *H01L 2221/6834* (2013.01); *H01L 2221/68381* (2013.01)

(58) Field of Classification Search
CPC ................. H01L 21/6836; H01L 22/12; H01L 2221/6834; H01L 2221/68386; H01L 22/30; H01L 22/26; H01L 23/58; H01L 22/10; G01N 3/00
USPC ...................................... 438/14, 12, 16, 459
See application file for complete search history.

(56) References Cited

U.S. PATENT DOCUMENTS

| | | | | |
|---|---|---|---|---|
| 2010/0079635 A1* | 4/2010 | Yano | .................... | G02B 3/0062 348/294 |
| 2010/0079893 A1* | 4/2010 | Honda | .................. | B82Y 10/00 360/55 |
| 2014/0030547 A1* | 1/2014 | Chida | ....................... | C23C 2/06 428/659 |

FOREIGN PATENT DOCUMENTS

JP 2009-290148 12/2009

* cited by examiner

*Primary Examiner* — Vu A Vu
(74) *Attorney, Agent, or Firm* — Greer Burns & Crain, Ltd.

(57) ABSTRACT

An adhesion detecting method detects the degree of adhesion of a protective tape having an adhesive layer to a wafer having devices on the front side. A protective tape is attached to the front side of the wafer with the adhesive layer facing the wafer. The protective tape is then peeled from the front side of the wafer. An arbitrary specific region on the front side of the wafer is imaged to detect a first height difference of first unevenness. A corresponding region on the adhesive layer of the peeled protective tape is imaged to detect a second height difference of second unevenness formed on the adhesive layer. The first height difference and the second height difference are compared with each other to determine whether or not the second height difference falls within an allowable range with respect to the first height difference.

1 Claim, 5 Drawing Sheets

ADHESION DETECTING METHOD

BACKGROUND OF THE INVENTION

Field of the Invention

The present invention relates to an adhesion detecting method for detecting the degree of adhesion of a protective tape attached to the front side of a wafer such as a semiconductor wafer.

Description of the Related Art

In a semiconductor device fabrication process, a plurality of crossing division lines are formed on the front side of a substantially disk-shaped semiconductor wafer to thereby define a plurality of separate regions, and a plurality of devices such as ICs and LSIs are each formed in these separate regions. The back side of the semiconductor wafer thus having the devices on the front side is ground to reduce the thickness of the semiconductor wafer to a predetermined thickness (back grinding step). Thereafter, the semiconductor wafer is cut along the division lines to thereby divide these separate regions where the devices are formed from each other, thus producing a plurality of individual device chips.

The back grinding step of grinding the back side of the semiconductor wafer to reduce the thickness of the semiconductor wafer to a predetermined thickness includes the steps of attaching a protective tape to the front side of the semiconductor wafer to protect the front side of the semiconductor wafer, next holding the semiconductor wafer on a chuck table of a grinding apparatus in the condition where the protective tape is in contact with the upper surface of the chuck table, and next grinding the back side of the semiconductor wafer by using abrasive members included in the grinding apparatus.

As a method of dividing a wafer such as a semiconductor wafer, there has been proposed a laser processing method including the steps of applying a pulsed laser beam having a transmission wavelength to the wafer from the back side of the wafer along each division line in the condition where the focal point of the pulsed laser beam is set inside the wafer, thereby continuously forming a modified layer inside the wafer along each division line, next grinding the back side of the wafer to reduce the thickness of the wafer to a predetermined thickness, and next applying an external force to the wafer to thereby break the wafer along each division line where the modified layer is formed to be reduced in strength, thus obtaining the individual device chips.

Also in this wafer dividing method, a protective tape is attached to the front side of the wafer, so as to protect the front side of the wafer (see Japanese Patent Laid-open No. 2009-290148, for example).

SUMMARY OF THE INVENTION

However, the front side of the wafer such as a semiconductor wafer has microscopic unevenness, so that there is a case that the protective tape may not be closely attached to the front side of the wafer. When the protective tape is not closely attached to the front side of the wafer, there arises a problem such that the wafer may be broken in grinding the back side of the wafer or the device chips divided may come into contact with each other to cause damage.

It is therefore an object of the present invention to provide an adhesion detecting method for detecting the degree of adhesion of the protective tape attached to the front side of the wafer such as a semiconductor wafer.

In accordance with an aspect of the present invention, there is provided an adhesion detecting method for detecting the degree of adhesion of a protective tape having an adhesive layer to a wafer in attaching the protective tape to the front side of the wafer, a plurality of division lines being formed on the front side of the wafer to thereby define a plurality of separate regions where a plurality of devices are each formed, the adhesion detecting method including a protective tape attaching step of attaching the protective tape to the front side of the wafer in the condition where the adhesive layer faces the front side of the wafer; a protective tape peeling step of peeling the protective tape from the front side of the wafer; a first height difference detecting step of imaging an arbitrary specific region on the front side of the wafer to detect a first height difference of first unevenness present on the front side of the wafer; a second height difference detecting step of imaging a corresponding region on the adhesive layer of the protective tape peeled from the front side of the wafer corresponding to the specific region to detect a second height difference of second unevenness formed on the adhesive layer by the transfer of the first unevenness from the front side of the wafer to the adhesive layer; and a determining step of comparing the first height difference and the second height difference with each other and determining whether or not the second height difference falls within an allowable range with respect to the first height difference, wherein when the second height difference falls within the allowable range, the degree of adhesion is determined to pass, whereas when the second height difference falls out of the allowable range, the degree of adhesion is determined to fail.

Preferably, the adhesive layer of the protective tape is formed of an adhesive material curable by applying ultraviolet radiation; the adhesion detecting method further including an adhesive layer curing step of applying ultraviolet radiation to the adhesive layer of the protective tape attached to the front side of the wafer before performing the protective tape peeling step, thereby curing the adhesive layer.

According to the adhesion detecting method of the present invention, the degree of adhesion of the protective tape to the wafer can be detected easily and reliably. In the case that the degree of adhesion is determined to fail in the determining step, a further experiment may be conducted to accumulate data, which may be used as materials in developing and studying a method or apparatus for closely attaching the protective tape to the front side of the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
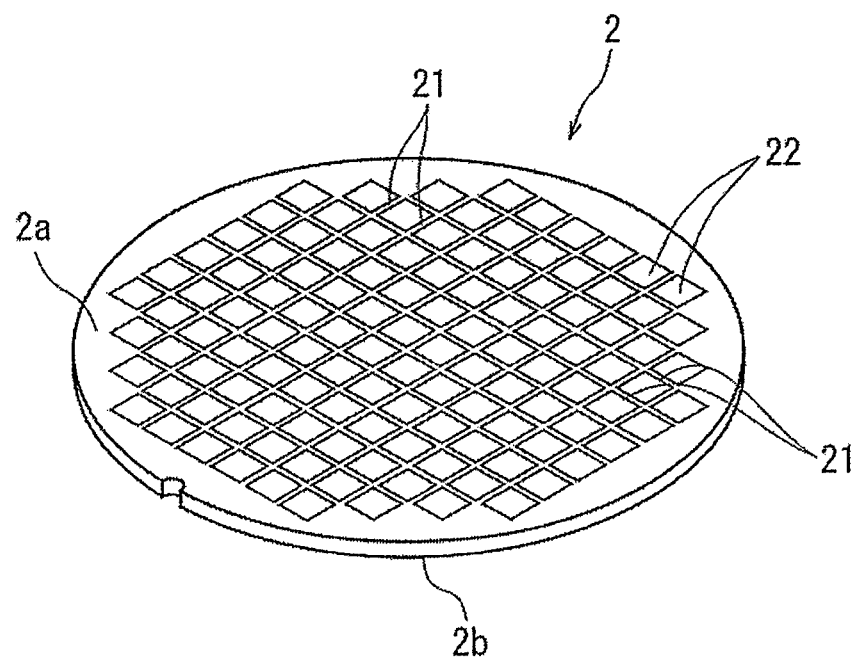
FIG. 1A is a perspective view of a semiconductor wafer.
Figure 1B:
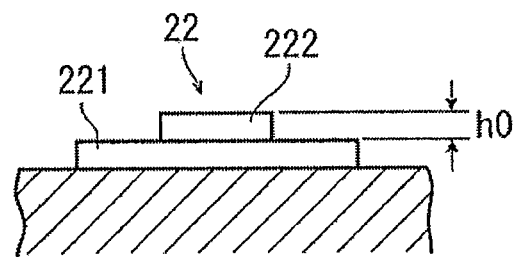
FIG. 1B is an enlarged sectional view of an essential part of the semiconductor wafer shown in FIG. 1A.

A preferred embodiment of an adhesion detecting method according to the present invention will now be described in detail with reference to the attached drawings. FIG. 1A is a perspective view of a semiconductor wafer 2 as a wafer to be used in the adhesion detecting method according to the present invention, and FIG. 1B is an enlarged sectional view of an essential part of the semiconductor wafer 2 shown in FIG. 1A. The semiconductor wafer 2 is a silicon wafer having a thickness of 500 μm, for example. As shown in FIG. 1A, the semiconductor wafer 2 has a front side 2a and a back side 2b. A plurality of crossing division lines 21 are formed on the front side 2a of the semiconductor wafer 2 to thereby define a plurality of separate regions where a plurality of devices 22 such as ICs and LSIs are each formed. As shown in FIG. 1B, each device 22 is composed of a base portion 221 and a central portion 222 higher in level than the base portion 221. The height (h0) from the front side (upper surface) of the base portion 221 to the front side (upper surface) of the central portion 222 is set to 15 μm, for example. There will now be described the adhesion detecting method according to the present invention to be performed by using the semiconductor wafer 2 mentioned above.

Figure 2A:
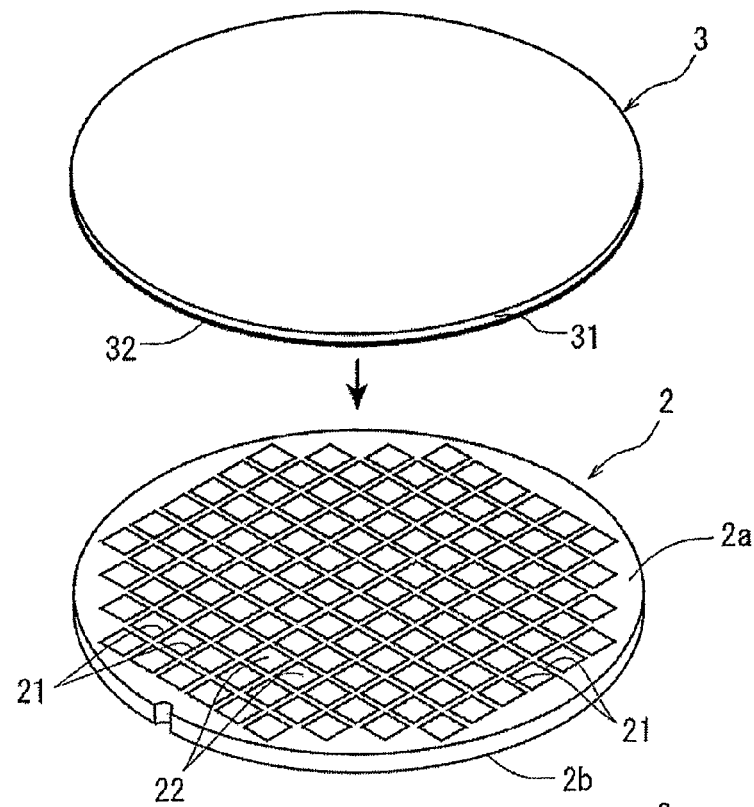
FIGS. 2A to 2C are perspective views showing a protective tape attaching step in an adhesion detecting method according to the present invention.
Figure 2B:
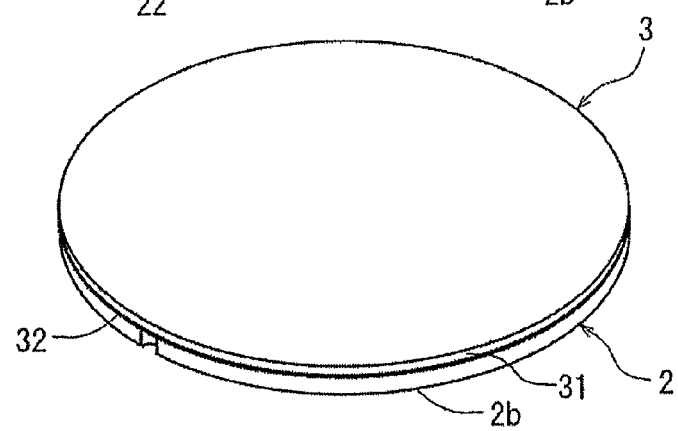
Figure 2C:
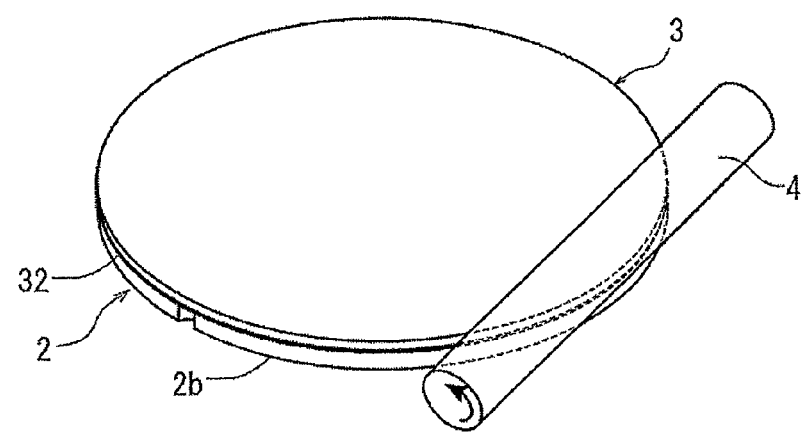

First, a protective tape attaching step is performed in such a manner that a protective tape having an adhesive layer is attached to the front side 2a of the semiconductor wafer 2 in the condition where the adhesive layer faces the front side 2a. More specifically, as shown in FIGS. 2A and 2B, reference numeral 3 denotes a protective tape composed of a base sheet 31 and an adhesive layer 32 formed on one side of the base sheet 31. This protective tape 3 is set on the front side 2a of the semiconductor wafer 2 so that the adhesive layer 32 faces the front side 2a. Thereafter, as shown in FIG. 2C, a roller 4 is rolled on the protective tape 3 to thereby attach the protective tape 3 to the front side 2a of the semiconductor wafer 2. The base sheet 31 is formed from a PVC (polyvinyl chloride) sheet having a thickness of 100 μm, for example. The adhesive layer 32 is formed of an adhesive material curable by applying ultraviolet radiation and has a thickness of 40 μm, for example. The degree of adhesion between the protective tape 3 and the front side 2a of the semiconductor wafer 2 changes according to the elasticity of the roller 4 and the pressure to be applied to the roller 4, for example. Accordingly, it is important to detect the degree of adhesion of the protective tape 3 attached to the front side 2a of the semiconductor wafer 2 and then accumulate data on the degree of adhesion detected above, wherein such data is used to determine an optimum elasticity of the roller 4 and an optimum pressure to be applied to the roller 4 and is also used as materials in developing and studying a method or apparatus for closely attaching the protective tape 3 to the front side 2a of the semiconductor wafer 2.

Figure 3:
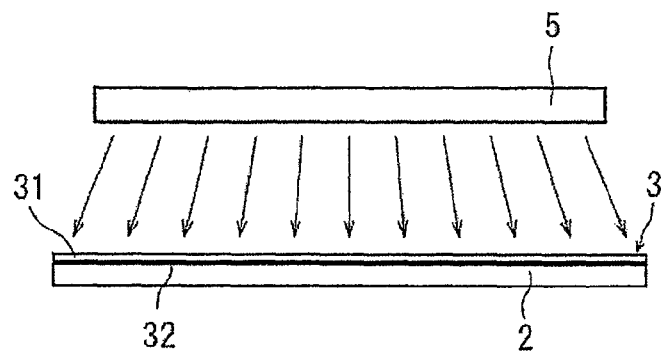
FIG. 3 is a schematic side view for illustrating an adhesive layer curing step.

Thereafter, an adhesive layer curing step is performed in such a manner that ultraviolet radiation is applied to the adhesive layer 32 of the protective tape 3 attached to the front side 2a of the semiconductor wafer 2, thereby curing the adhesive layer 32 in order to detect the degree of adhesion of the protective tape 3 attached to the front side 2a of the semiconductor wafer 2. More specifically, as shown in FIG. 3, ultraviolet radiation applying means 5 is operated to apply ultraviolet radiation to the protective tape 3 attached to the front side 2a of the semiconductor wafer 2 from the base sheet 31 side. As described above, the base sheet 31 constituting the protective tape 3 is formed from a PVC (polyvinyl chloride) sheet which can transmit ultraviolet radiation, so that the ultraviolet radiation is applied through the base sheet 31 to the adhesive layer 32, thereby curing the adhesive layer 32. When the adhesive layer 32 is cured as described above, unevenness on the front side 2a of the semiconductor wafer 2 is transferred to the adhesive layer 32 of the protective tape 3 and this transferred unevenness can be reliably maintained on the adhesive layer 32. Further, the adhesive force of the adhesive layer 32 is reduced by the application of the ultraviolet radiation.

Figure 4:
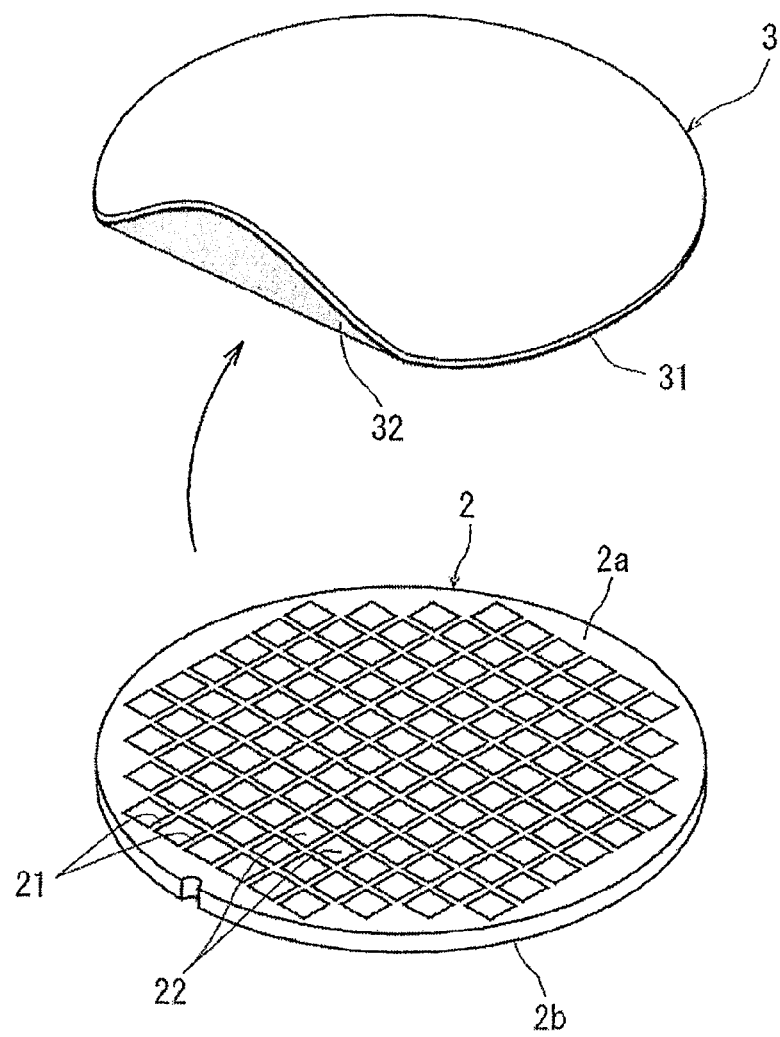
FIG. 4 is a perspective view showing a protective tape peeling step.

After performing the adhesive layer curing step, the protective tape 3 is peeled from the front side 2a of the semiconductor wafer 2 as shown in FIG. 4 (protective tape peeling step). Since the adhesive layer 32 of the protective tape 3 is cured to reduce its adhesive force in the adhesive layer curing step, the protective tape 3 can be easily peeled from the front side 2a of the semiconductor wafer 2 in the protective tape peeling step.

Figure 5A:
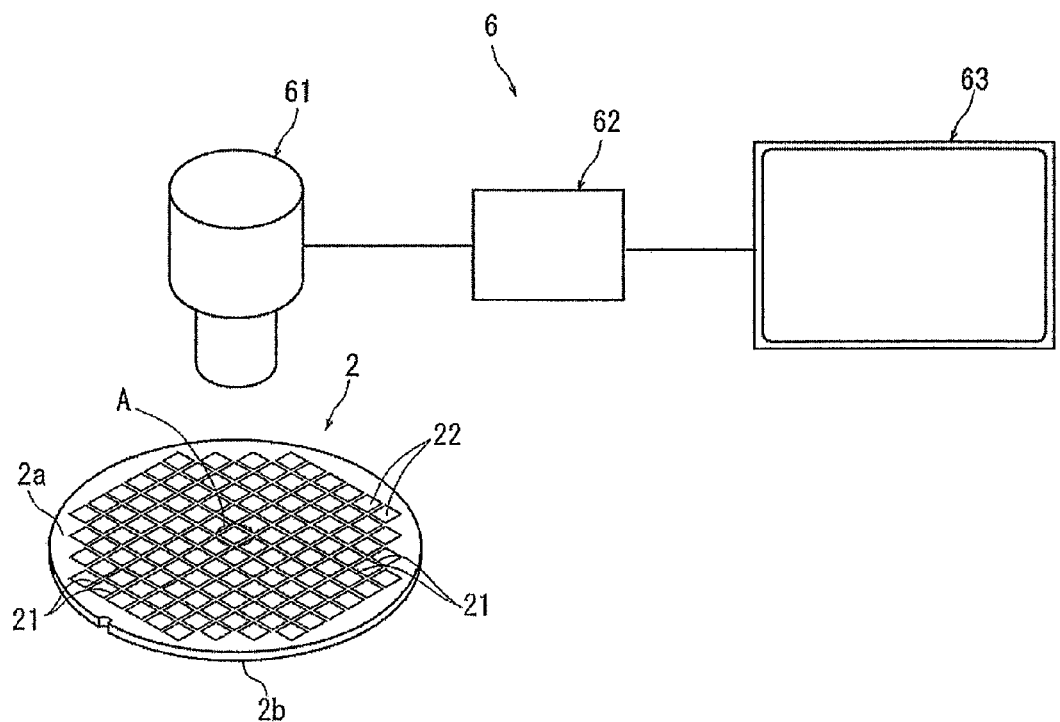
FIGS. 5A to 5C are views for illustrating a first height difference detecting step.

Thereafter, a first height difference detecting step is performed in such a manner that an arbitrary specific region on the front side 2a of the semiconductor wafer 2 is imaged to detect a first height difference of the unevenness on the front side 2a. The first height difference detecting step is performed by using a height difference detecting apparatus 6 shown in FIG. 5A. The height difference detecting apparatus 6 shown in FIG. 5A includes imaging means 61 having an autofocus function, control means 62 for inputting an image signal obtained by the imaging means 61 and executing image processing, and display means 63 for displaying an image obtained by the control means 62. In performing the first height difference detecting step by using the height difference detecting apparatus 6, an arbitrary specific region A on the front side 2a of the semiconductor wafer 2 is positioned directly below the imaging means 61 as shown in FIG. 5A. This arbitrary specific region A is set to a central region including the device 22 formed at the center of the semiconductor wafer 2 in this preferred embodiment.

Figure 5B:
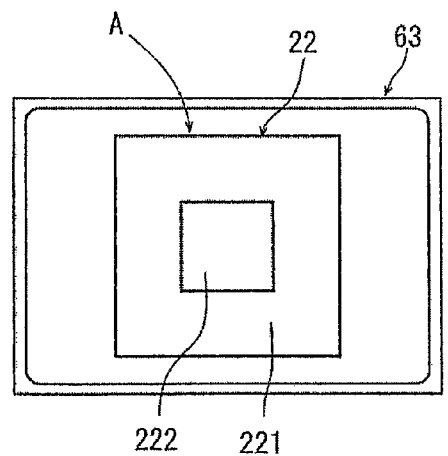

In the condition where the arbitrary specific region A on the front side 2a of the semiconductor wafer 2 is positioned directly below the imaging means 61 as shown in FIG. 5A, the specific region A is imaged by the imaging means 61 to obtain an image signal, which is then sent to the control means 62. At this time, a focal point is set on the front side (upper surface) of the central portion 222 constituting the device 22 in the specific region A by the autofocus function of the imaging means 61, and a focal length (f1) as the distance from a reference point to the front side of the central portion 222 is sent to the control means 62. After inputting the image signal and the focal length (f1) from the imaging means 61, the control means 62 temporarily stores the image signal and the focal length (f1) in a memory included in the control means 62, and displays an image according to the image signal on the display means 63 as shown in FIG. 5B.

Thereafter, the base portion 221 constituting the device 22 in the arbitrary specific region A on the front side 2a of the semiconductor wafer 2 is positioned directly below the imaging means 61, and the imaging means 61 is operated to set a focal point on the front side (upper surface) of the base portion 221. At this time, a focal length (f2) as the distance from the reference point to the front side of the base portion 221 is detected by the autofocus function of the imaging means 61 and a detection signal is sent to the control means 62. After inputting the detection signal indicating the focal length (f2) from the imaging means 61, the control means 62 temporarily stores the focal length (f2) in the memory.

Figure 5C:
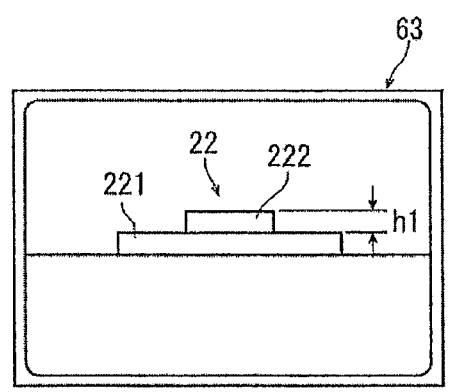

In this manner, the control means 62 inputs the focal length (f1) as the distance from the reference point to the front side of the central portion 222 of the device 22 and the focal point (f2) as the distance from the reference point to the front side of the base portion 221 of the device 22. Thereafter, the control means 62 determines the height (h1) of the central portion 222 from the front side of the base portion 221 (h1=f2−f1). After determining the height (h1) of the central portion 222 from the front side of the base portion 221, the control means 62 displays an image indicating the height (h1) of the central portion 222 on the display means 63 as shown in FIG. 5C. The first height difference detecting step may be performed before performing the protective tape attaching step.

Thereafter, a second height difference detecting step is performed in such a manner that a corresponding region on the adhesive layer 32 of the protective tape 3 peeled from the front side 2a of the semiconductor wafer 2 corresponding to the specific region A is imaged to detect a second height difference of the unevenness formed on the adhesive layer 32 by the transfer of the unevenness from the front side 2a of the semiconductor wafer 2 to the adhesive layer 32. The second height difference detecting step is performed by using the height difference detecting apparatus 6 described above with reference to FIG. 5A. In performing the second height difference detecting step, a corresponding region B on the adhesive layer 32 of the protective tape 3 peeled from the front side 2a of the semiconductor wafer 2 corresponding to the specific region A is positioned directly below the imaging means 61 as shown in FIG. 6A.

Figure 6A:
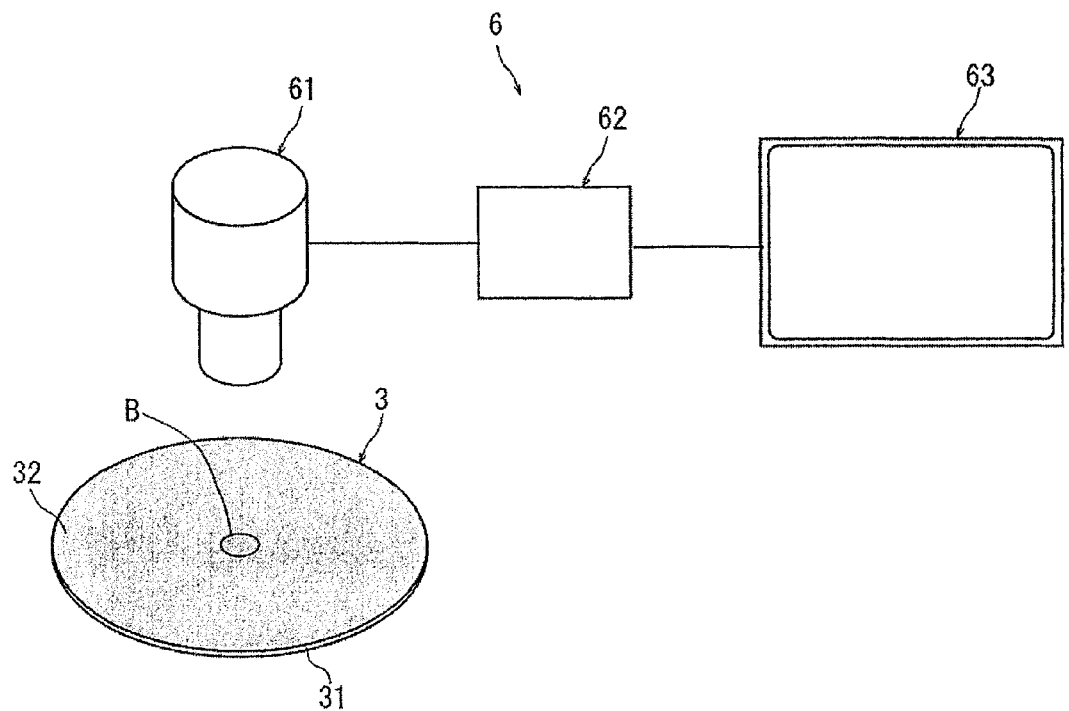
FIGS. 6A to 6C are views for illustrating a second height difference detecting step.
Figure 6B:
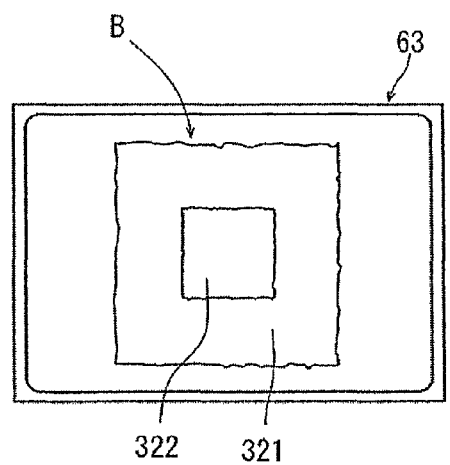

In the condition where the corresponding region B on the adhesive layer 32 of the protective tape 3 peeled from the front side 2a of the semiconductor wafer 2 corresponding to the specific region A is positioned directly below the imaging means 61 as shown in FIG. 6A, the corresponding region B is imaged by the imaging means 61 to obtain an image signal, which is then sent to the control means 62. At this time, a focal point is set on the bottom surface of a first recess 322 in the corresponding region B by the autofocus function of the imaging means 61, wherein the first recess 322 corresponds to the central portion 222 of the device 22 in the specific region A. Further, a focal length (f3) as the distance from the reference point to the bottom surface of the first recess 322 is sent to the control means 62. After inputting the image signal and the focal length (f3) from the imaging means 61, the control means 62 temporarily stores the image signal and the focal length (f3) in the memory and displays an image according to the control signal on the display means 63 as shown in FIG. 6B. The image shown in FIG. 6B includes the first recess 322 corresponding to the central portion 222 of the device 22 and a second recess 321 corresponding to the base portion 221 of the device 22.

Thereafter, the second recess 321 (corresponding to the base portion 221 of the device 22) in the corresponding region B on the adhesive layer 32 of the protective tape 3 peeled from the front side 2a of the semiconductor wafer 2 is positioned directly below the imaging means 61, and the imaging means 61 is operated to set a focal point on the bottom surface of the second recess 321. At this time, a focal length (f4) as the distance from the reference point to the bottom surface of the second recess 321 is detected by the autofocus function of the imaging means 61 and a detection signal is sent to the control means 62. After inputting the detection signal indicating the focal length (f4) from the imaging means 61, the control means 62 temporarily stores the focal length (f4) in the memory.

Figure 6C:
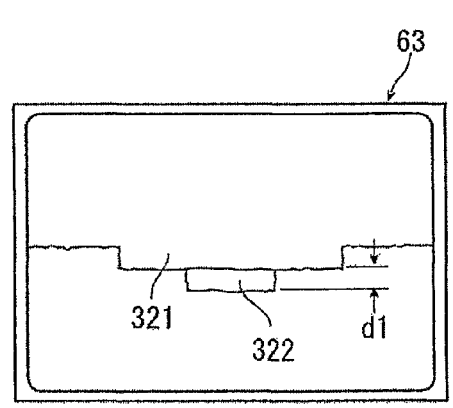

In this manner, the control means 62 inputs the focal length (f3) as the distance from the reference point to the bottom surface of the first recess 322 and the focal length (f4) as the distance from the reference point to the bottom surface of the second recess 321. Thereafter, the control means 62 determines the depth (d1) from the bottom surface of the second recess 321 to the bottom surface of the first recess 322 (d1=f3−f4). After determining the depth (d1) from the bottom surface of the second recess 321 to the bottom surface of the first recess 322, the control means 62 operates the display means 63 to display an image indicating the depth (d1) of the first recess 322 formed on the adhesive layer 32 of the protective tape 3 peeled from the front side 2a of the semiconductor wafer 2 as shown in FIG. 6C.

After performing the second height difference detecting step as mentioned above, a determining step is performed in such a manner that the first height difference and the second height difference are compared with each other, and when the second height difference falls within an allowable range with respect to the first height difference, the degree of adhesion is determined to pass, whereas when the second height difference falls out of the allowable range, the degree of adhesion is determined to fail. In this preferred embodiment, the height (h1) (the first height difference) of the central portion 222 from the front side of the base portion 221 of the device 22 as detected in the first height difference detecting step is compared with the depth (d1) (the second height difference) of the first recess 322 on the adhesive layer 32 of the protective tape 3 peeled from the front side 2a of the semiconductor wafer 2 as detected in the second height difference detecting step. Then, it is determined whether or not the depth (d1) of the first recess 322 on the adhesive layer 32 of the protective tape 3 peeled from the front side 2a of the semiconductor wafer 2 falls within an allowable range (e.g., h1−2 μm≤d1≤h1) with respect to the height (h1) of the central portion 222 from the front side of the base portion 221 of the device 22. For example, in the case that the height (h1) of the central portion 222 from the front side of the base portion 221 of the device 22 is 15 μm and that the depth (d1) of the first recess 322 on the adhesive layer 32 of the protective tape 3 is 14 μm, the depth (d1) falls within the allowable range (15−2≤14≤15), so that the degree of adhesion is determined to pass. In contrast, when the depth (d1) of the first recess 322 on the adhesive layer 32 of the protective tape 3 is 12 μm, the depth (d1=12 μm) is less than the lower limit (13 μm) of the allowable range, that is, the depth (d1) falls out of the allowable range, so that the degree of adhesion is determined to fail. This determining step is performed by the control means 62, and the result of determination is displayed on the display means 63.

In the case that the degree of adhesion is determined to pass in the determining step mentioned above, the elasticity of the roller 4 and the pressure to be applied to the roller 4 used in the protective tape attaching step are proper and this step may continue to be performed. On the other hand, in the case that the degree of adhesion is determined to fail in the determining step mentioned above, a further experiment is conducted to determine optimum values for the elasticity of the roller 4 and the pressure to be applied to the roller 4. Further, the results of this experiment may be used as materials in developing and studying a method or apparatus for closely attaching the protective tape 3 to the front side 2a of the semiconductor wafer 2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An adhesion detecting method for detecting the degree of adhesion of a protective tape having an adhesive layer to a wafer in attaching said protective tape to the front side of said wafer, a plurality of division lines being formed on the front side of said wafer to thereby define a plurality of separate regions where a plurality of devices are each formed, said adhesion detecting method comprising:
- a protective tape attaching step of attaching said protective tape to the front side of said wafer in the condition where said adhesive layer faces the front side of said wafer;
- a protective tape peeling step of peeling said protective tape from the front side of said wafer;
- a first height difference detecting step of imaging an arbitrary specific region on the front side of said wafer to detect a first height difference of first unevenness present on the front side of said wafer;
- a second height difference detecting step of imaging a corresponding region on said adhesive layer of said protective tape peeled from the front side of said wafer corresponding to said specific region to detect a second height difference of second unevenness formed on said adhesive layer by the transfer of said first unevenness from the front side of said wafer to said adhesive layer; and
- a determining step of comparing said first height difference and said second height difference with each other and determining whether or not said second height difference falls within an allowable range with respect to said first height difference, wherein when said second height difference falls within said allowable range, the degree of adhesion is determined to pass, whereas when said second height difference falls out of said allowable range, the degree of adhesion is determined to fail, wherein said adhesive layer of said protective tape is formed of an adhesive material curable by applying ultraviolet radiation;

said adhesion detecting method further comprising an adhesive layer curing step of applying ultraviolet radiation to said adhesive layer of said protective tape attached to the front side of said wafer before performing said protective tape peeling step, thereby curing said adhesive layer.

* * * * *